(12) United States Patent
Hakoda et al.

(10) Patent No.: US 8,988,064 B2
(45) Date of Patent: Mar. 24, 2015

(54) CURRENT DETECTION CIRCUIT AND TRANSFORMER CURRENT MEASURING SYSTEM

(75) Inventors: Yasunori Hakoda, Saitama (JP); Kimiyoshi Kobayashi, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 318 days.

(21) Appl. No.: 13/061,964

(22) PCT Filed: Feb. 5, 2010

(86) PCT No.: PCT/JP2010/000697
§ 371 (c)(1),
(2), (4) Date: Mar. 3, 2011

(87) PCT Pub. No.: WO2010/090032
PCT Pub. Date: Aug. 12, 2010

(65) Prior Publication Data
US 2011/0163738 A1  Jul. 7, 2011

(30) Foreign Application Priority Data

Feb. 6, 2009  (JP) ................................. 2009-026813
Jul. 29, 2009  (JP) ................................. 2009-176386

(51) Int. Cl.
*G01R 15/18* (2006.01)
*H02M 3/335* (2006.01)
(Continued)

(52) U.S. Cl.
CPC ............ *H02M 3/335* (2013.01); *G01R 15/185* (2013.01); *G01R 19/0092* (2013.01); *G01R 19/18* (2013.01); *H02M 2001/0009* (2013.01)
USPC ........................................................ 324/127

(58) Field of Classification Search
CPC ........ G01R 31/40; G01R 15/18; G01R 15/181; G01R 15/183; G01R 15/186
USPC ........... 324/117 R, 117 H, 120, 126, 127, 142
See application file for complete search history.

(56) References Cited

U.S. PATENT DOCUMENTS 4,717,994 A * 1/1988 Diaz et al. ...................... 363/17
4,769,754 A * 9/1988 Reynolds et al. ............... 363/71
(Continued)

FOREIGN PATENT DOCUMENTS

| CN | 1428924 A | 7/2003 |
|---|---|---|
| CN | 101425751 A | 5/2009 |

(Continued)

OTHER PUBLICATIONS

Yang et al., "LLC Resonant Converter for Front End DC/DC Conversion", Applied Power Electronics Conference and Exposition, 2002. APEC 2002. Seventeenth Annual IEEE.
(Continued)

*Primary Examiner* — Huy Q Phan
*Assistant Examiner* — Adam Clarke

(57) ABSTRACT

A current detection circuit and a transformer current measurement system are offered, in which when elements and circuit, which cannot operate originally unless a transformer with small excitation inductance is used, are connected to a primary side of the transformer, even if the transformer, whose excitation inductance is large, is used, transformer current (primary current and secondary current) can be measured without deteriorating operations of the elements and circuit.
[Means for solving] A current detector CT (current transformer) is in series connected to a primary winding 111 of a transformer 11, and an inductor $L_a$ is in parallel connected to to a series connection of the current detector CT and the primary winding 111. And, secondary current $I_2$ of the transformer 11 is measured based on a value of primary current $I_T$ detected by the current detector CT.

7 Claims, 13 Drawing Sheets

(51) Int. Cl.
*G01R 19/00* (2006.01)
*G01R 19/18* (2006.01)
*H02M 1/00* (2006.01)

(56) References Cited

U.S. PATENT DOCUMENTS

| | | | |
|---|---|---|---|
| 6,590,787 B2* | 7/2003 | Yasumura | 363/21.03 |
| 6,842,350 B2* | 1/2005 | Yamada et al. | 363/21.16 |
| 7,532,488 B2 | 5/2009 | Tsuruya | |
| 7,615,989 B2* | 11/2009 | Kojori | 324/127 |
| 2004/0120165 A1* | 6/2004 | Tobita | 363/21.01 |
| 2004/0196678 A1* | 10/2004 | Yoshimura et al. | 363/79 |
| 2006/0104097 A1 | 5/2006 | Tsuruya | |
| 2008/0291702 A1* | 11/2008 | Hosotani | 363/21.02 |
| 2010/0033156 A1* | 2/2010 | Abe et al. | 323/305 |
| 2010/0085782 A1* | 4/2010 | Halberstadt | 363/25 |
| 2011/0316524 A1* | 12/2011 | Kim et al. | 324/120 |
| 2014/0117972 A1* | 5/2014 | Chiba et al. | 324/76.11 |

FOREIGN PATENT DOCUMENTS

| | | | |
|---|---|---|---|
| JP | 5-260741 A | 10/1993 | |
| JP | 10-271817 A | 10/1998 | |
| JP | H10-271817 A | 10/1998 | |
| JP | 3138992 B2 | 2/2001 | |
| WO | 2004/036726 A1 | 4/2004 | |
| WO | WO 2005-025043 A1 | 3/2005 | |

OTHER PUBLICATIONS

International Search Report of PCT/JP2010/000697, Apr. 27, 2010.
Korea Patent Office, Office Action for Korean Patent Application No. 10-2010-7022950, Mar. 26, 2012.
China Patent Office (SIPO), Office Action for Chinese Patent Application No. 2010800014485, Oct. 14, 2012.
Bo et al., LLC Resonant Converter for Front End DC/DC Conversion, IEEE, pp. 1-17 to 1-21, 2002.
China Patent Office (SIPO), Office Action for Chinese Patent Application No. 201080001448.5, Jun. 20, 2013.
China Patent Office (SIPO), Search Report for Chinese Patent Application No. 201080001448.5, Jun. 20, 2013.

* cited by examiner

US 8,988,064 B2

CURRENT DETECTION CIRCUIT AND TRANSFORMER CURRENT MEASURING SYSTEM

TECHNICAL FIELD

The present invention relates to a technology of measuring current (primary current or secondary current), which flows through a transformer having a large excitation inductance.

BACKGROUND ART

A technique for avoiding magnetization saturation of a transformer by exciting current of the transformer is conventionally known.

FIG. 11 shows a power converter 8 comprising a transformer 81, a switch circuit 82 connected to a primary winding 811 of the transformer 81, a rectification circuit 83 connected to a secondary winding 812, and a smoothing circuit 84 provided in an output side of the rectification circuit 83. In FIG. 11, the switch circuit 82 is made up of a switching element $Q_1$, and the rectification circuit 83 is made up of two switching elements $Q_{21}$ and $Q_{22}$. Moreover, the smoothing circuit 84 is made up of an inductor $L_O$ and a capacitor $C_O$.

In the power converter 8, the transformer 81, which has a small excitation inductance (exciting current $I_{ex}$ is large), is used to enable flux reset of the transformer, and a current sensor CT is provided to the primary winding 811. Primary load current $I_{1Load}$ of the transformer 81 is reflected as the secondary current $I_2$. That is, $I_2 = n \times I_{1Load}$, where a winding ratio is expressed by n (the number of the primary winding $N_1$/the number of the secondary winding $N_2$), so that the secondary current $I_2$ can be measured by detecting the primary current $I_1$, without directly detecting the secondary current $I_2$. The power converter 8 is suitable for avoiding malfunction due to a noise of the secondary current, or reducing measurement loss (power loss at time of measurement), where the winding ratio n is large. FIG. 12 shows the primary current primary load current $I_1$, $I_{1road}$, the secondary current $I_2$ and the exciting current $I_{ex}$, and also shows relation of ON/OFF states of the switches $Q_1$, $Q_{21}$, and $Q_{22}$ therewith.

On the other hand, a technology, which uses exciting current of a transformer in order to operate a circuit and apparatus provided in the primary side of the transformer, is also known.

FIG. 13 shows a power converter 9, in which a switch circuit 92 provided in a primary side of a transformer 91, is made up of a semiconductor switch, and power conversion is performed by a ZVS (zero bolt switching) method (refer to patent document 1). In this transformer 91, the excitation inductance of the primary winding 911 is intentionally made small.

In FIG. 13, the switch circuit 92 is formed by a bridge made up of switches $Q_{11}$, $Q_{12}$, $Q_{13}$, and $Q_{14}$ (MOSFETs in the figure). Direct current voltage $DC_{IN}$ is given to an input terminal of the switch circuit 92, and the primary winding 911 is connected to an output terminal thereof through a resonance circuit 95, which is made up of an inductor $L_1$ and a capacitor $C_1$.

Moreover, a rectification circuit 93, which is made up of diodes $D_{21}$, $D_{22}$, $D_{23}$, and $D_{24}$, is provided in a secondary side of the transformer 91. An input side of the rectification circuit 93 is connected to a secondary winding 912, and a load is connected to an output side thereof through a smoothing circuit 94 (capacitor $C_2$).

A parasitism diode and a parasitism capacitance (capacitor) are formed in the switches $Q_{11}$, $Q_{12}$, $Q_{13}$, and $Q_{14}$, and for example, if the switches $Q_{11}$ and $Q_{14}$ are turned off while the switches $Q_{11}$ and $Q_{14}$ are turned on and the switches $Q_{12}$ and $Q_{13}$ are turned off, a resonance occurs due to the parasitism capacitance of the switches $Q_{12}$ and $Q_{13}$ and circuit inductance, so that terminal voltage of the switches $Q_{12}$ and $Q_{13}$ becomes zero. A ZVS is realized by turning on the switches $Q_{12}$ and $Q_{13}$ at the timing of this terminal voltage.

In FIG. 13, the excitation inductance of the primary winding of the transformer 91 is designed small (the exciting current is large), and the current (exciting current $I_{ex}$) resulting from the excitation inductance greatly contributes to the ZVS action.

Patent Document 1: Japanese Patent Application Publication No. H07-322613
Patent Document 2: International Patent Application Publication No. WO 2005/025043

DESCRIPTION OF THE INVENTION

Subject Matter to be Solved by the Invention

In the power converter 8 of FIG. 11, when the secondary current is measured based on a detection value of the primary current (shown by exciting current $I_{ex}$ and primary load current $I_{1Load}$), apparent from waveform of the primary current $I_1$ of FIG. 12 (which is shown as the exciting current $I_{ex}$ and the primary load current $I_{1Load}$ in FIG. 11), even if the primary current $I_1$ is detected by, for example, CT etc., since the primary current $I_1$ includes the large exciting current $I_{ex}$, the secondary current $I_2$ cannot be measured based thereon. The reason that the exciting current is large (excitation inductance is small) is it is necessary to enable flux reset of the transformer 81.

Moreover, in the power converter 9 shown in FIG. 13, at timing of the ZVS action of the switches, which forms the switch circuit 92, there may be a case where the secondary current $I_2$ may be measured based on a detection value of the primary current $I_1$ (which is shown by exciting current $I_{ex}$ and primary load current $I_{1Load}$). However, in this case, since the exciting current $I_{ex}$ of the transformer 91 of the power converter 9 is large, the secondary current $I_2$ cannot be measured from a detection value of the primary current $I_1$.

In addition, a technology is proposed, in that current (pseudo exciting current) corresponding to exciting current is actually generated and the primary current proportional to the secondary current is obtained by removing the pseudo exciting current from the actual primary current, in order to indirectly measure the secondary current of the transformer (refer to patent document 2). However, in the technique disclosed in the patent document 2, the configuration of the circuit for pseudo exciting current is complicated, and moreover, the pseudo exciting current is not necessarily be generated highly precisely.

It is an object of the present invention to offer a current detection circuit and a transformer current measurement system, wherein when elements and circuit, which cannot operate originally unless a transformer with small excitation inductance is used, are connected to a primary side of the transformer, even if the transformer, whose excitation inductance is large, is used, transformer current (primary current and secondary current) can be measured without deteriorating operations of the above-mentioned elements and circuit.

Means for Solving the Problem

A great deal of consideration was made by the present inventors based on an idea that a function of a transformer with low excitation inductance would be realized with a transformer having high excitation inductance, in a transformer system, in which elements and circuit, which cannot operate originally unless the transformer with low excitation inductance is used, are connected to the primary side. As a result, it is concluded that the above problem can be solved if only primary side current can be increased without affecting secondary current, whereby the present invention was made.

A current detection circuit according to the present invention will be summarized in (1) to (4) below.

(1) A current detection circuit of a switching power source having a transformer, which detects current flowing through a primary side of a transformer, comprises a current detection unit, which is in series connected to a primary winding of the transformer, and which detects current flowing through the primary side of the transformer, and an inductor connected in parallel to a series connection portion, in which the primary winding of the transformer and the current detection unit are in series connected to each other.

In the current detection circuit of the present invention, current, which flows through the winding of the transformer, i.e., the primary current and secondary current, can be measured. The primary current is current which, actually flows through the primary winding, and includes exciting current and primary load current (which is obtained by excluding the exciting current from the primary current). The secondary current can be theoretically obtained from the primary load current based on the winding ratio n (the number of secondary winding $N_1$/the number of secondary winding $N_2$). The current detection circuit according to the present invention is suitable for measurement of transformer current of the transformer used for a power converter (DC/DC converter etc.).

(2) In the current detection circuit described in (1), the inductance of the inductor is smaller than the excitation inductance of the primary winding of the transformer.

When the secondary current is measured based on a detection value of the primary current, the smaller the exciting current, the higher the measurement accuracy of the secondary current. For example, in some of the apparatuses, each of which uses a transformer such as a power converter, a transformer with small excitation inductance (that is, exciting current is large) is sometimes used in a positive manner, in order to perform a ZVS operation, and an magnetic flux reset action of the transformer, etc. In such an apparatus, the secondary current cannot be measured even when the primary current is measured. According to the present invention, a transformer equivalent to a transformer with small excitation inductance can be realized by a transformer with large excitation inductance, and the secondary current can be measured by detecting the primary current.

(3) A switching power source having a transformer and a first inductor connected in series to a primary winding of the transformer, comprises a current detection circuit for detecting current flowing through the primary side of the transformer, wherein the current detection circuit includes a current detection unit, which is in series connected to the primary winding of the transformer, and which detects current flowing through the primary side of the transformer, and a second inductor, which is in parallel connected to a series connection portion, in which the primary winding of the transformer, the first inductor, and the current detection circuit are in series connected to one another.

In the current detection circuit according to the present invention, the current, which flows through the primary winding of the transformer is detected by the current detection unit. And at least part of the exciting current generated in the primary side of the transformer flows through the second inductor, not the primary winding of the transformer. For this reason, since the exciting current included in the current detected by the current detection unit decreases, the detection accuracy of resonance current, which flows through the primary side of the transformer can be improved. Moreover, current, which flows through the secondary side of the transformer, can be measured with high precision, while suppressing an increase of the number of component parts and the circuit structure is prevented from getting complicated.

(4) In the current detection circuit described in (3), the inductance of the second inductor may be smaller than the excitation inductance of the primary winding of the transformer.

It is possible to increase the current, which is part of the exciting current generated in the primary side of the transformer, and which flows through the second inductor, not the primary winding of the transformer. For this reason, the detection accuracy of the resonance current, which flows through the primary side of the transformer, can be further improved.

(5) The transformer current measuring system according to the present invention, is summarized in (5) and (6) below.

(5) In a transformer current measuring system, a current detector may be in series connected to a primary winding of a transformer, and an inductor is in parallel connected to the series connection of the primary winding and the current detector.

In the transformer current measuring system according to the present invention, it is possible to measure the current, which flows through the winding of the transformer, i.e., the primary current and the secondary current. The primary current is current which actually flows through the primary winding, and includes exciting current and primary load current (which is obtained by excluding the exciting current from the primary current). The secondary current can be theoretically obtained from the primary load current according to the winding ratio n (secondary winding several $N_2$/primary winding $N_1$). The transformer current measuring system according to the present invention is suitable for measurement of the transformer current of the transformer used for a power converter (DC-DC converter etc.).

(6) In the transformer current measuring system described in (5), the inductance of the inductor is smaller than the excitation inductance of the primary winding.

When the secondary current is measured based on a detection value of the primary current, as the exciting current is smaller, the accuracy of measurement of the secondary current becomes higher. For example, in some of apparatuses, each of which uses a transformer such as a power converter etc., such a transformer having small excitation inductance (that is, exciting current is large) may be positively used, in order to perform a ZVS operation, or a magnetic flux reset operation of the transformer. In such a apparatus, the secondary current cannot be measured by detecting primary current. According to the present invention, a transformer equivalent to a transformer having small excitation inductance can be realized by using a transformer having large excitation inductance, and further, the secondary current can be measured by detecting the primary current.

Effects of the Invention

According to the present invention, even if a transformer having large excitation inductance is used when elements or a circuit (for example, a switch for performing a ZVS operation), which cannot be originally operated unless a transformer having small excitation inductance is used, is connected to a primary side thereof, transformer current (primary current and secondary current) can be measured without deteriorating operations of the elements and circuit.

Since in the present invention, a transformer having large excitation inductance can be used, secondary current can be measured based on a detection result of primary current, without being affected by the exciting current. For example, when a winding ratio is large (when secondary current is larger than primary current), since the secondary current is not actually detected, malfunction due to a secondary side noise can be suppressed, and it is also possible to quickly respond to excess current in the secondary side. When a rectification switch is provided in the secondary side, a synchronous rectification drive of the switch can be performed with high degree of accuracy.

Moreover, according to the present invention, an ohmic loss of the primary winding can be made smaller by larger part of the excitation inductance (smaller part of the exciting current). Furthermore, since a degree of coupling between windings becomes high, losses (eddy current loss etc.) resulting from a low coupling degree can also be reduced.

According to the present invention, the secondary current can be easily measured with a simple circuit structure without generating pseudo-exciting current. As a result, it is possible to reduce a manufacturing cost by reducing parts therefor, and products can be uniformized since the number of the parts is small.

According to the present invention, it is possible to improve the detection accuracy of resonance current, which flows through a primary side of a transformer, by reducing the exciting current included in the current detected by the current detection unit. Moreover, the current, which flows through the secondary side of the transformer, can be measured with high precision, while an increase in component parts, and complication of a circuit configuration are suppressed.

BEST MODE FOR CARRYING OUT THE INVENTION

Description of an embodiment according to the present invention will be given below, referring to figures. In addition, it is possible to suitably replace components described in embodiments with known components etc. Moreover, there can be wide variations including combination with other known components. Therefore, the following embodiments do not limit the scope of the claimed invention.

<First Embodiment>

Figure 1:
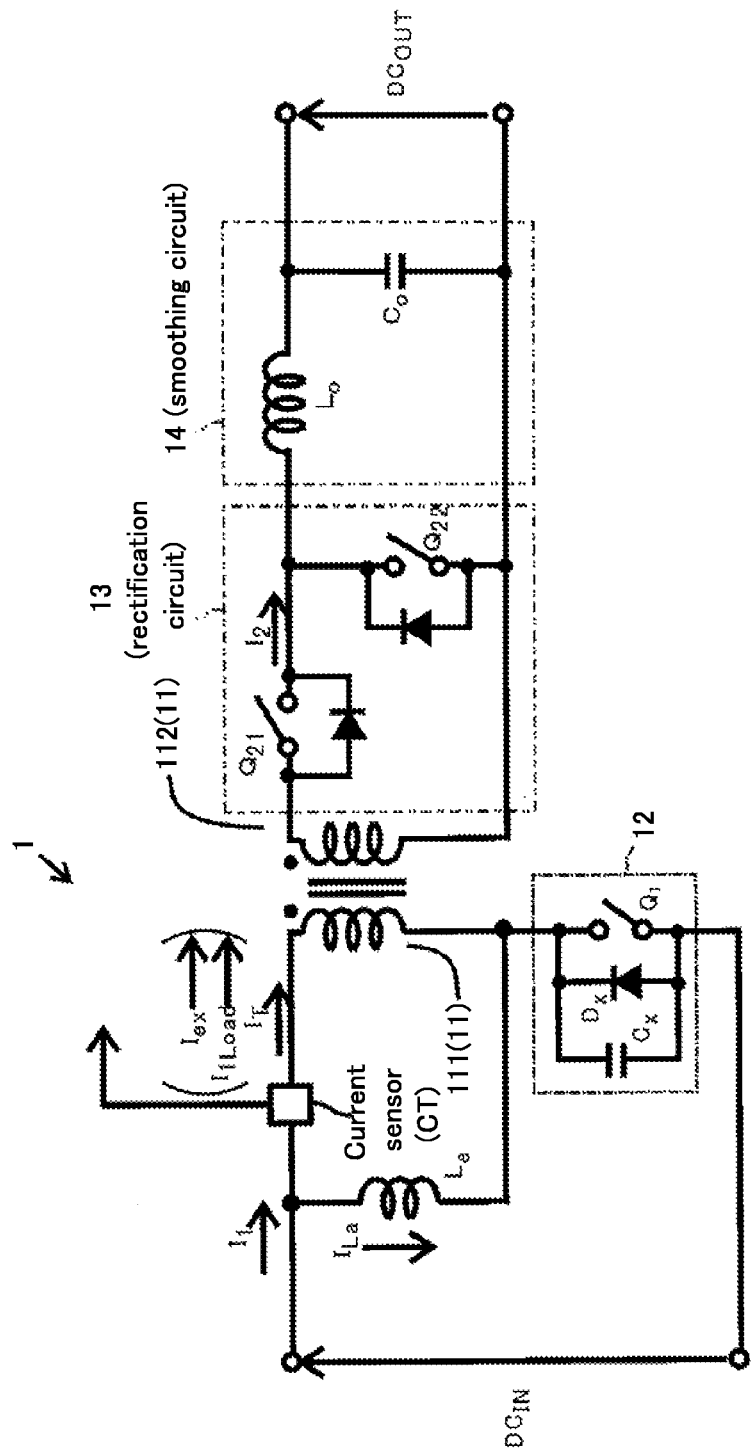
FIG. 1 shows a basic form of a transformer current measuring system according to a first embodiment of the present invention.

FIG. 1 shows a basic form of the transformer current measuring system according to a first embodiment of the present invention, to which a DC-DC converter using a transformer is applied. As shown in FIG. 1, a DC-DC converter 1 is equipped with a transformer 11, a switching circuit 12, a rectification circuit 13 and a smoothing circuit 14. Direct current voltage $DC_{IN}$ is impressed to an input terminal of the DC-DC converter 1, and direct current voltage $DC_{OUT}$ is outputted from an output terminal thereof.

A current detector CT is connected in series to a primary winding 111 of the transformer 11, and an inductor $L_a$ is in parallel connected to the series connection formed by the primary winding 111 and the current detector CT. The rectification circuit 13 is connected to a secondary winding 112 of the transformer 11, and the smoothing circuit 14 is connected to an output side of the rectification circuit 13.

In addition, in FIG. 1, the switching circuit 12 is made up of a switch $Q_1$. A parasitic diode and a parasitism capacitance (capacitor), which are formed in the switch $Q_1$, are shown as Dx and Cx, respectively.

In FIG. 1, current $I_1$ (hereinafter referred to as "primary current"), which is supplied to the transformer from the input terminal $DC_{IN}$, flows into the inductor $L_a$ and the primary winding 111. Current, which flows through the inductor $L_a$, is shown as $I_{La}$, and current (transformer current), which flows through the primary winding 111 is shown as $I_T$.

The transformer current $I_T$ is made up of exciting current $I_{ex}$ and primary load current $I_{1Load}$. The inductance of the inductor $L_a$ is designed so that the current (inductor current) $I_{La}$, which flows through the inductor $L_a$, may become sufficiently larger than the exciting current $I_{ex}$.

Figure 2:
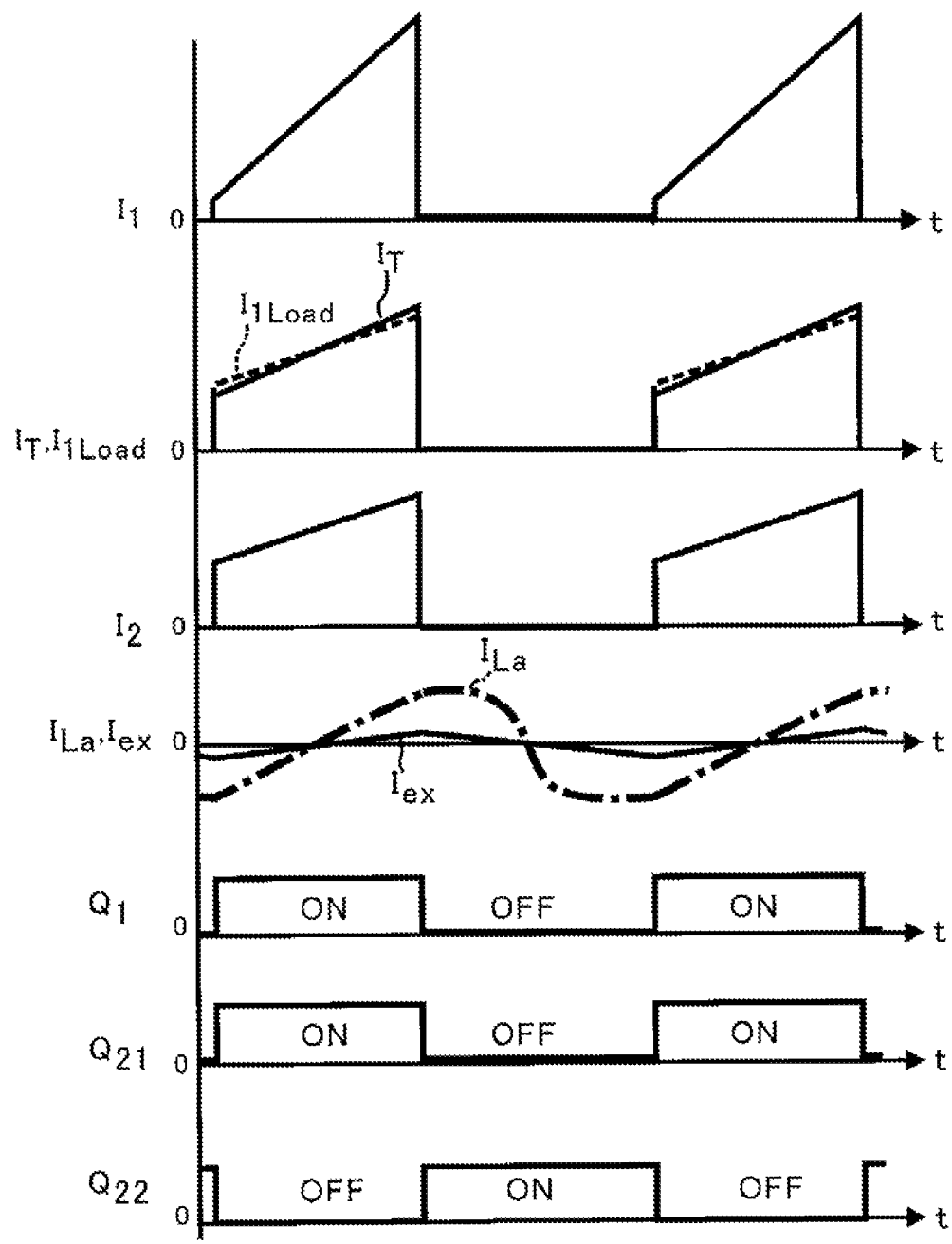
FIG. 2 is a waveform chart showing an operation of each part in the system chart of FIG. 1.

FIG. 2 shows the primary current $I_1$, transformer current-primary load current $I_T I_{1Load}$, the secondary current $I_2$, and the inductor current exciting current $I_{La}$· $I_{ex}$, and also shows relation of ON/OFF states of switches $Q_1$, $Q_{21}$, and $Q_{22}$ therewith.

A detection signal sent from the current detector (CT), which is connected to the primary winding, is sent to a controlling circuit (not shown), so that a driving signal for driving the switch (the switch $Q_1$ in FIG. 1), which forms the switching circuit 12, is generated in the controlling circuit. In the DC-DC converter 1 shown in FIG. 1, when an magnetic flux of the transformer is reset by generating counter electromotive force in the transformer 11, the counter electromotive force is compensated by the inductor $L_a$. Apparent from FIG. 2, the exciting current $I_{ex}$ is small, so that a characteristic of the detection current ($I_T$) of the current detector CT is substantially the same as that of the secondary current $I_2$.

Figure 3:
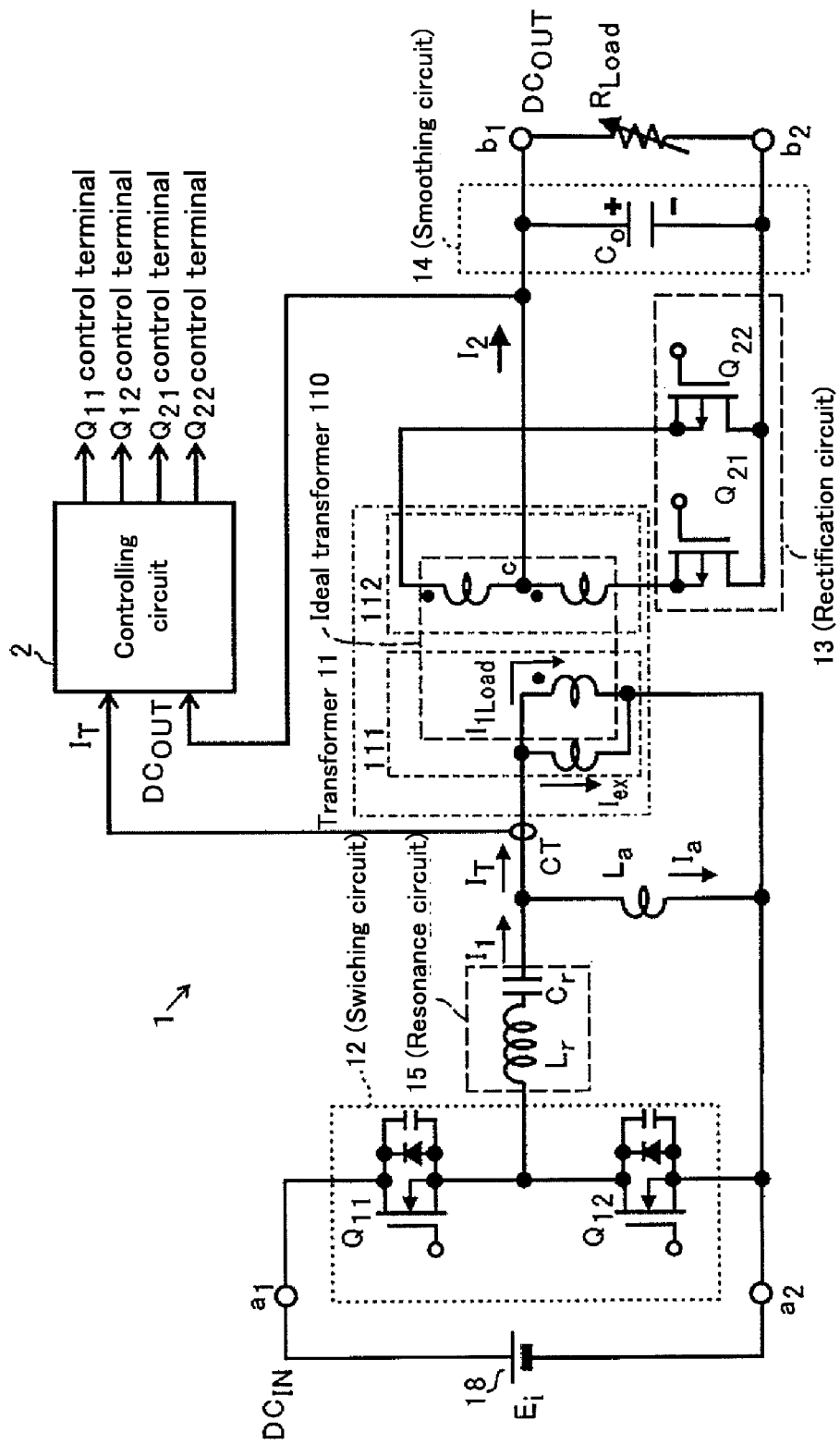
FIG. 3 shows a concrete example of the transformer current measuring system (shown in FIG. 1) according to an embodiment of the present invention.

FIG. 3 shows a concrete example of the transformer current measuring system shown in FIG. 1, according to an embodiment of the present invention. In FIG. 3, the DC-DC converter 1 is equipped with the switching circuit 12 (a half bridge, which is made up of a series circuit formed by input switches $Q_{11}$ and $Q_{12}$), the transformer 11, the inductor $L_a$ with low inductance, the rectification circuit 13, the smoothing circuit 14 (an output capacitor $C_O$), and a resonance circuit 15 (a series connection formed by an inductor Lr and a capacitor Cr).

A $Q_{11}$ side terminal ($a_1$) of the series circuit formed by the switches $Q_{11}$ and $Q_{12}$ is connected to a positive terminal of a direct current power source (Ei) 18, and a $Q_{12}$ side terminal ($a_2$) of the series circuit is connected to a negative terminal of the direct current power source 18. A connecting point of the switches $Q_{11}$ and $Q_{12}$ is connected to one of the terminals of the primary winding 111 of the transformer 11 through the resonance circuit 15. In addition, the other terminal of the primary winding 111 is connected to the terminal $a_2$.

The current detector CT is connected in series to the primary winding 111 of the transformer 11, and the inductor $L_a$ is in parallel connected to the series connection formed by the primary winding 111 and the current detector CT. The current $I_a$, which flows through the inductor $L_a$, is larger than the exciting current $I_{ex}$, so that an ZVS operation of the switching circuit 12 is compensated by the current $I_a$, which flows through the inductor $L_a$.

Since the current $I_T$, which is supplied to the primary winding 111, is reflected as the secondary current $I_2$, the primary current $I_T$ detected by the current detector CT is substantially equivalent to the secondary current $I_2$. One of the terminals of the secondary winding 112 of the transformer 11 is connected to an output terminal (GND terminal) $b_2$ through the output switch $Q_{22}$, and the other terminal thereof is connected to the output terminal $b_2$ through the output switch $Q_{21}$.

Moreover, a center tap c of the secondary winding 112 of the transformer 11 is connected to the output terminal $b_1$, and the output capacitor $C_O$ is connected between the output terminals $b_1$ and $b_2$. In FIG. 3, a resistance load $R_{Load}$ is connected to the output terminals $b_1$ and $b_2$. The controlling circuit 2 receives a detection signal from the current detector CT, and is connected to the output voltage $DC_{OUT}$ (voltage of the output terminal $b_1$, $b_1$), and the controlling circuit 2 sends out driving signals to the switches $Q_{11}$, $Q_{12}$, $Q_{21}$, and $Q_{22}$.

Figure 4:
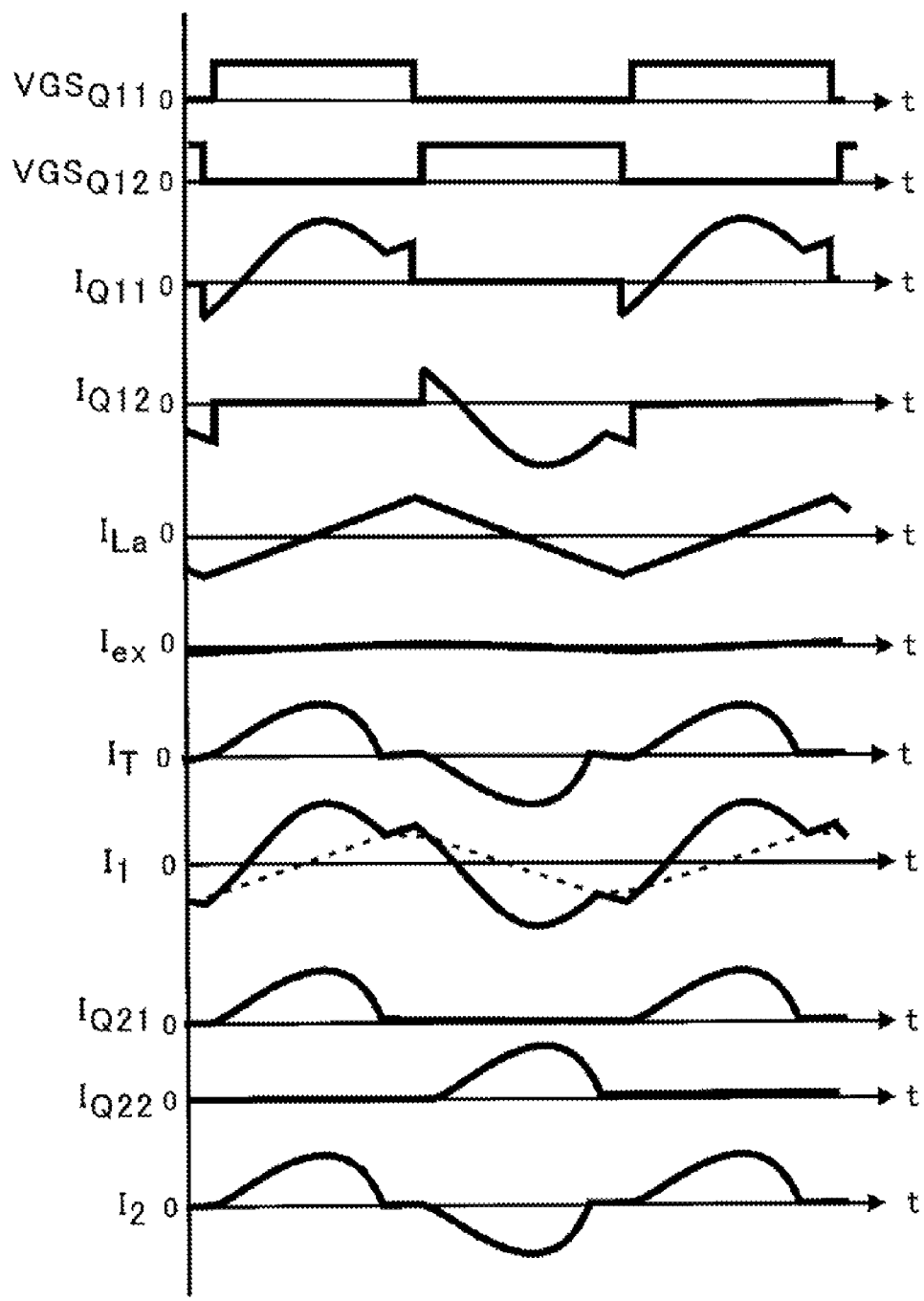
FIG. 4 is a waveform chart showing an operation of each part in the system chart of FIG. 3.

FIG. 4 shows control terminal (gate) signals of the switches $Q_{11}$ and $Q_{12}$, that is, $VGS_{Q11}$ and $VGS_{Q12}$, in DC-DC converter 1, primary current $I_{Q11}$ and $I_{Q12}$, which flows through the $Q_{11}$ and $Q_{12}$ respectively, current $I_{La}$, which flows through the inductor $L_a$, exciting current $I_{ex}$, transformer current $I_T$, the current $I_1$ (primary current), which flows through the resonance circuit 15, currents $I_{Q21}$ and $I_{Q22}$, which flow through the switches $Q_{21}$ and $Q_{22}$ respectively, and the secondary current $I_2$.

Figure 5:
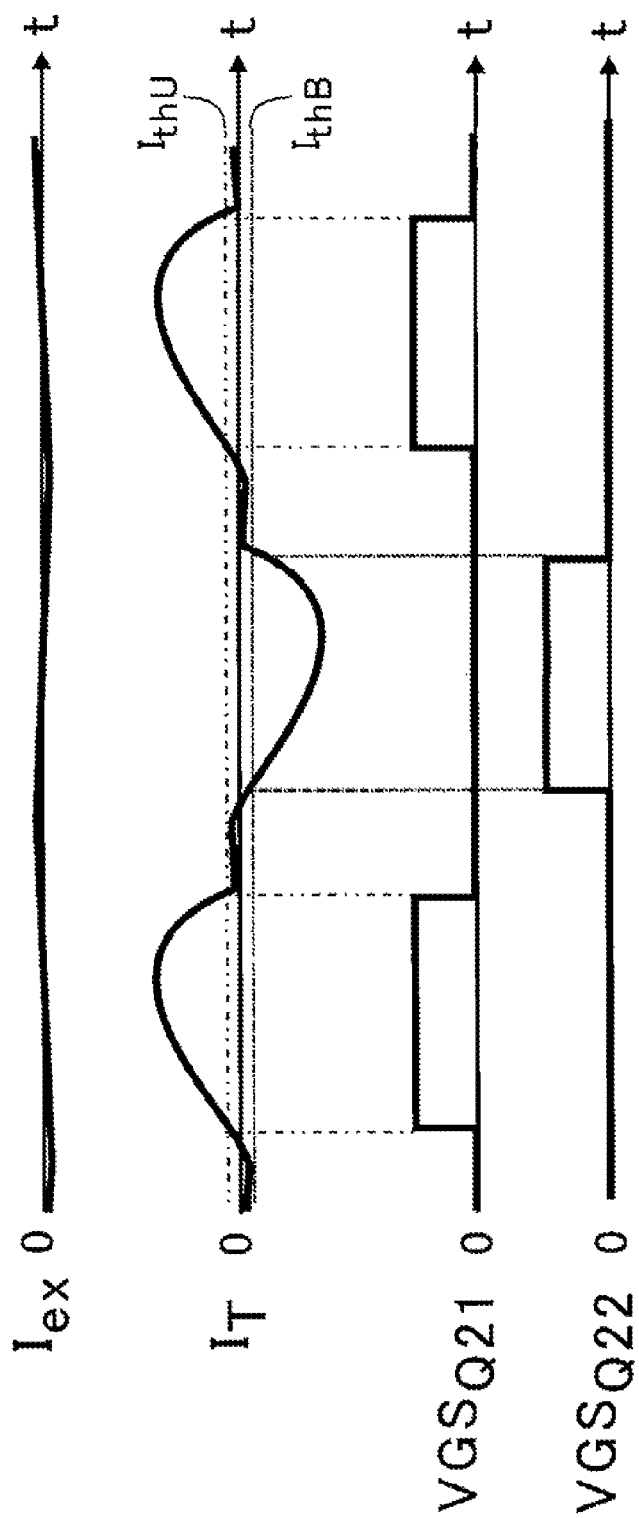
FIG. 5 is a waveform chart for explaining an operation of a DC-DC converter of FIG. 3 in detail.

FIG. 5 is an enlarged view of the $I_{ex}$, $I_T$, $VGS_{Q21}$, and $VGS_{Q22}$ shown in FIG. 4. As shown in FIG. 5, in this embodiment, the controlling circuit 2 regards the primary current $I_T$ of the transformer 11 as the secondary current $I_2$ (as having the same shape thereas except for amplitude thereof), so as to generate $VGS_{Q21}$ and $VGS_{Q22}$, whereby the switches $Q_{21}$ and $Q_{22}$ are turned on and off by the $VGS_{Q21}$ and $VGS_{Q22}$. In addition, as shown as $I_T$ in the waveform chart of FIG. 5, ON periods of $VGS_{Q21}$ and that of $VGS_{Q22}$ are respectively detected by threshold values $I_{thU}$ and $I_{thB}$ of $I_T$.

Figure 6:
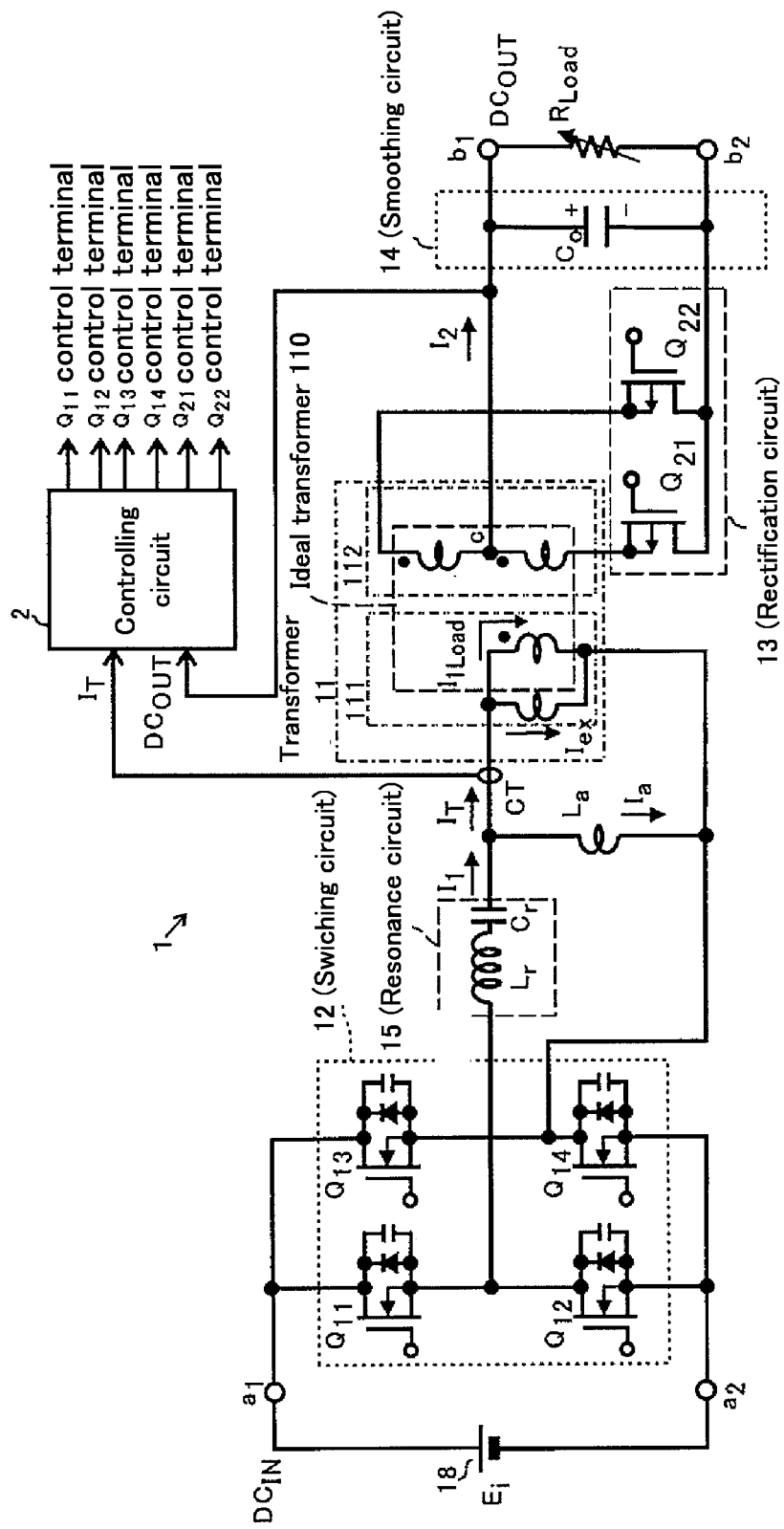
FIG. 6 is a circuit diagram showing a full bridge resonance type DC-DC converter to which a transformer current measuring system of the present invention is applied.
Figure 7:
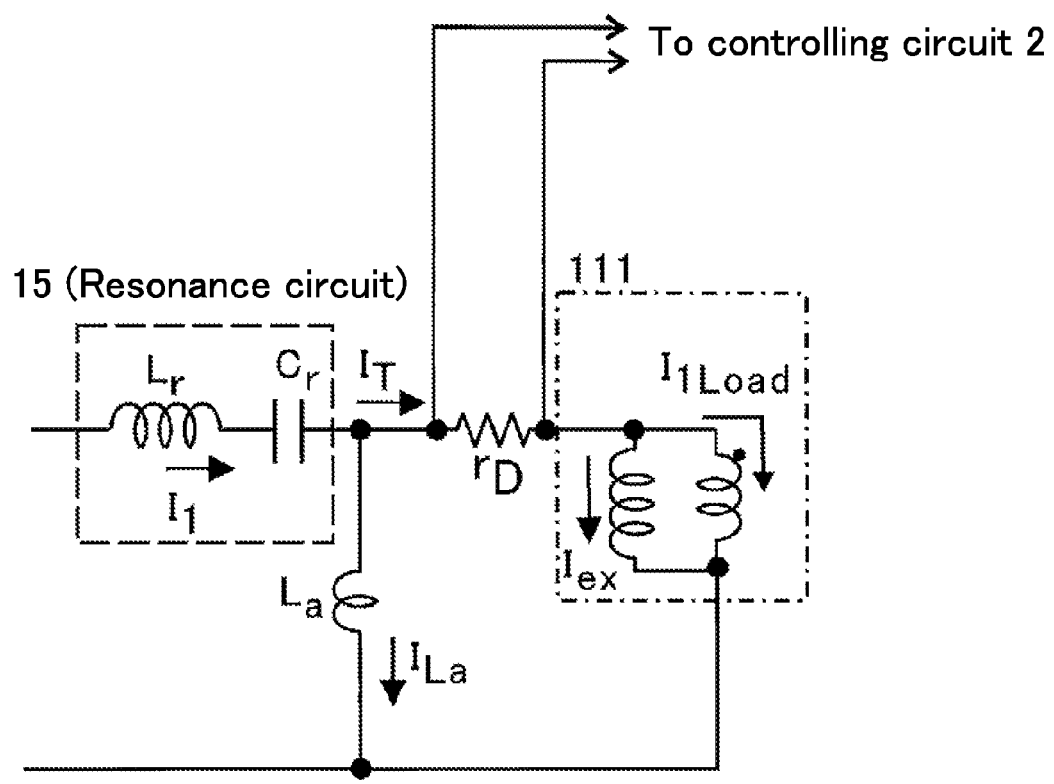
FIG. 7 is a diagram showing an embodiment of the present invention, wherein transformer current is measured by a detection resistor, which is in series connected to a primary winding.

As shown in FIG. 6, the transformer current measuring system of the present invention is applicable to a full bridge DC-DC converter. Although transformer current $I_T$ is measured by the current transformer (CT) in the above-mentioned embodiment, as shown in FIG. 7, a detection resistor $r_D$ may be in series connected to the primary winding 111, whereby the primary current $I_T$ may be measured by voltage drop of the detection resistor.

<Second Embodiment>
[The Structure of Switching Regulator 1A]

Figure 8:
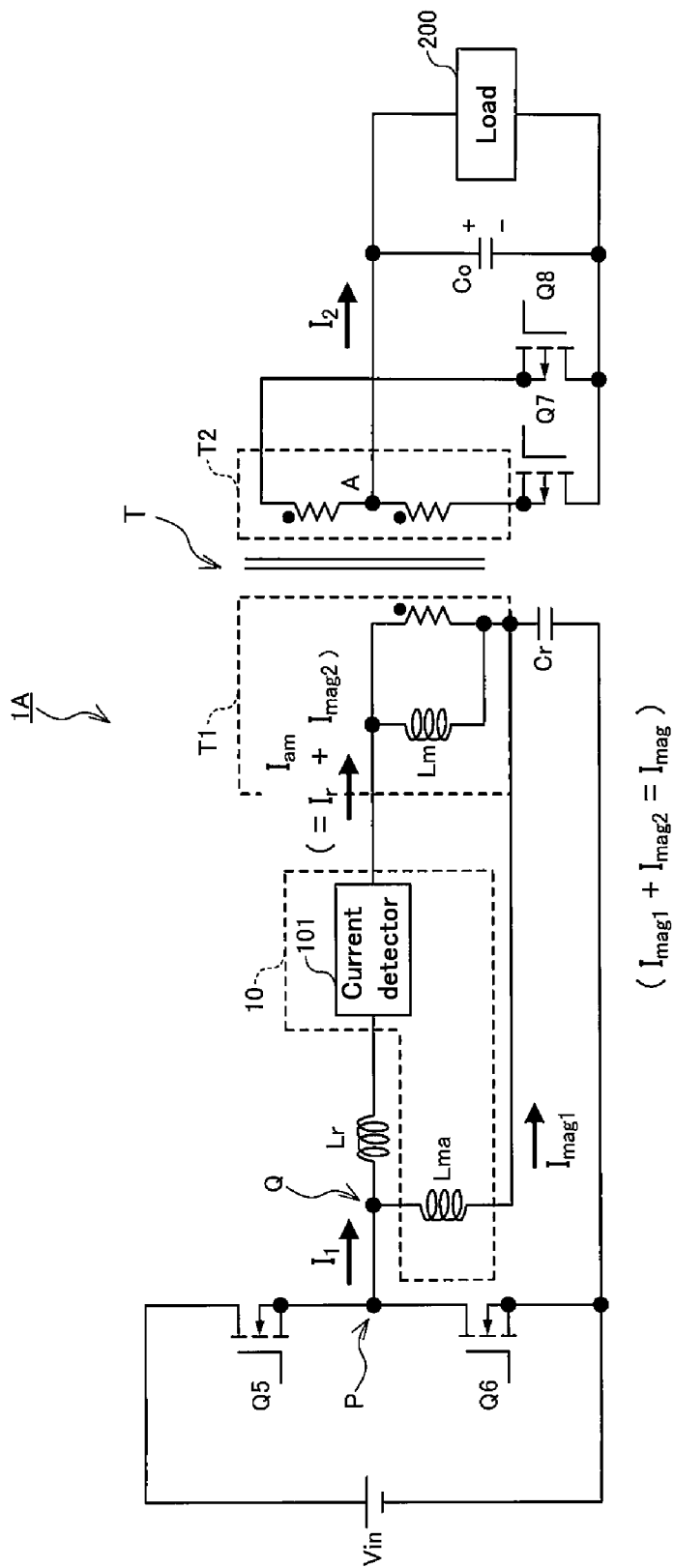
FIG. 8 is a circuit diagram of a switching power source having a current detector according to a second embodiment of the present invention.

FIG. 8 is a circuit diagram of a switching power source 1A including a current detection circuit 10 according to a second embodiment of the present invention. The switching power source 1A is so called a current resonance type switching power source, and supplies direct current voltage to a load 200. This switching power source 1A has a transformer T, a direct current power source Vin, switching elements Q5, Q6, Q7 and Q8, an inductor Lr and a capacitor Cr which forms a resonance circuit, a capacitor $C_O$, and a current detection circuit 10. The current detection circuit 10 comprises a current detection unit 101 and an inductor Lma, wherein current, which flows through a secondary side of the transformer is indirectly measured by detecting current, which flows through a primary side of the transformer.

First, description of the structure of the switching power source 1A in the primary side of the transformer T will be given below. The so-called half bridge circuit is provided in the primary side of the transformer T. Specifically, the switching elements Q5 and Q6 are N-channel MOSFETs respectively, and a positive terminal of the direct current power source Vin is connected to the drain of the switching element Q5, and a negative terminal of the direct current power source Vin is connected to the source of the switching element Q6. A gate of each of the switching elements Q5 and Q6 is connected to the control unit (not shown).

One end of the primary winding T1 of the transformer T is connected to the source of the switching element Q5 and the drain of the switching element Q6, through the inductor Lr and the current detection unit 101. The negative terminal of the direct current power source Vin is connected to the other end of the primary winding T1 of the transformer T through the capacitor Cr. In addition, the excitation inductance of the primary winding T1 of the transformer T is shown as Lm.

The inductor Lma is in parallel connected to a series connection portion, in which the inductor Lr, the current detection unit 101, and the primary winding T1 of the transformer T are in series connected to one another, and the inductance of the inductor Lma is smaller than the excitation inductance Lm of the primary winding T1 of the transformer T. For this reason, at least part of the exciting current $I_{mag}$ generated in the primary side of the transformer T flows through the inductor Lma, not the primary winding T1 of the transformer T.

Here, the resonance current, which flows through the primary side of the transformer T, is shown as $I_r$, the primary current, which flows through the primary side of the transformer T, is shown as $I_1$, the secondary current, which flows through the secondary side of the transformer T, is shown as $I_2$, and the detection current detected by the current detection unit 101 is shown as $I_{am}$. Moreover, out of the exciting current $I_{mag}$ generated in the primary side of the transformer T, current which flows through the inductor Lma, is shown as bypass exciting current $I_{mag1}$, current, which through flows the primary winding T1 of the transformer T, is shown as detection exciting current $I_{mag2}$. The following formulae (1) and (2) are expressed.

[Formula 1]

$$I_1 = I_{am} + I_{mag1} \tag{1}$$

[Formula 2]

$$I_{am} = I_r + I_{mag2} \tag{2}$$

Next, description of the structure of the switching power source 1A in the secondary side of the transformer T will be given below. The switching elements Q7 and Q8 are P-channel MOSFETs respectively, wherein one end of the secondary winding T2 of the transformer T is connected to the source of the switching element Q8, and the other end of the secondary winding T2 of the transformer T is connected to the source of the switching element Q7. While one of electrodes of the capacitor $C_O$ is connected to a center tap A of the secondary winding T2 of the transformer T, one end of a load 200 is connected to the center tap A. While the other electrode of the capacitor $C_O$ is connected to the drain of each of the switching elements Q7 and Q8, the other end of the load 200 is connected to the drain of each switching element.

[Operation of Switching Power Source 1A]

Figure 9:
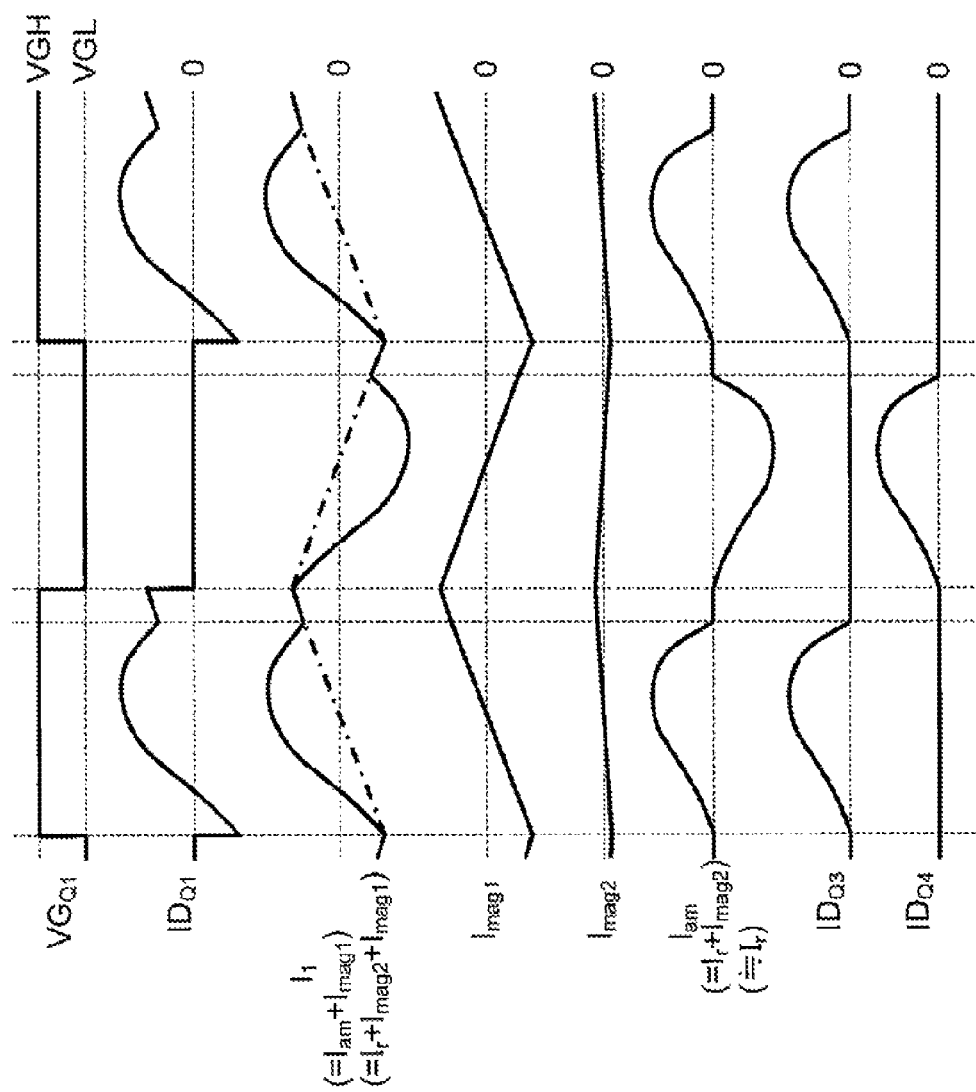
FIG. 9 is a timing chart of a switching power source.

FIG. 9 is a timing chart of the switching power source 1A. As shown in FIG. 9, the peak of the detection exciting current $I_{mag2}$ is much smaller than that of the bypass exciting current $I_{mag1}$, and is approximately equal to "0". That is, most of the exciting current $I_{mag}$, which is generated in the primary side of the transformer T, flows through the inductor Lma, and hardly flows through the primary winding T1 of the transformer T. For this reason, the detection current $I_{am}$ detected by the current detection unit 101 is approximately equal to the resonance current $I_r$, which flows through the primary side of the transformer T.

The above-described switching power source 1A has effects set forth below.

The inductor Lma, which forms the resonance circuit with the capacitor Cr, is in parallel connected to the series connection portion, in which the inductor Lr, the current detection unit 101 and the primary winding T1 of the transformer T are in series connected to one another. And the inductance of the inductor Lma is smaller than the excitation inductance Lm of the primary winding T1 of the transformer T. Thereby, most of the exciting current $I_{mag}$ generated in the primary side of the transformer T, flows through the inductor Lma, and hardly flows through the primary winding T1 of the transformer T. For this reason, the exciting current $I_{mag}$, which is included in the detection current $I_{am}$ detected by the current detection unit 101 is decreased, so that the detection accuracy of the resonance current $I_r$, which flows through the primary side of the transformer T, can be improved. Therefore, the secondary current $I_2$, which flows through the secondary side of the transformer T, can be measured with high precision, while an increase in the number of component parts is suppressed and the structure of a circuit is prevented from getting complicated.

<Third Embodiment>

[The Structure of the Switching Power Source 1B]

Figure 10:
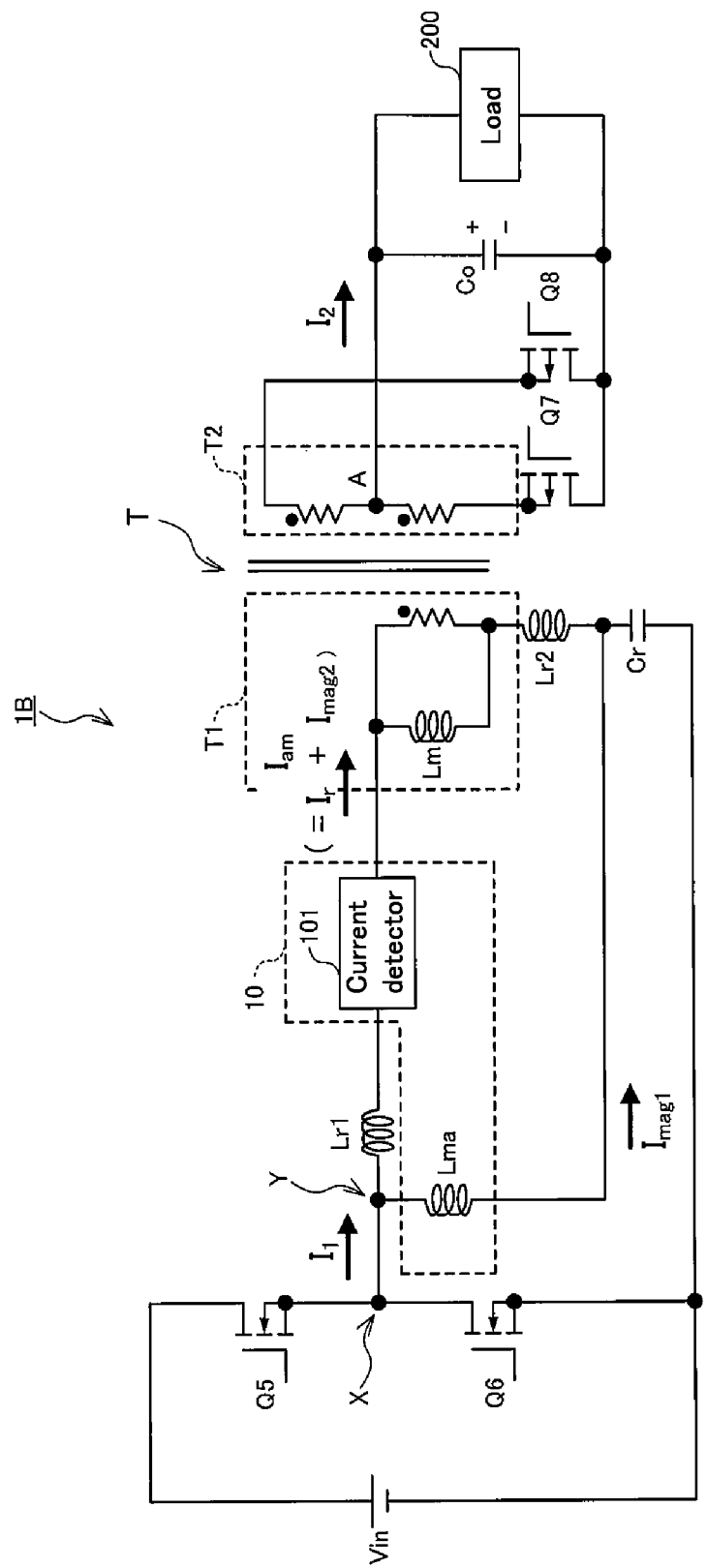
FIG. 10 is a circuit diagram of a switching power source including a current detector according to a third embodiment of the present invention.
Figure 11:
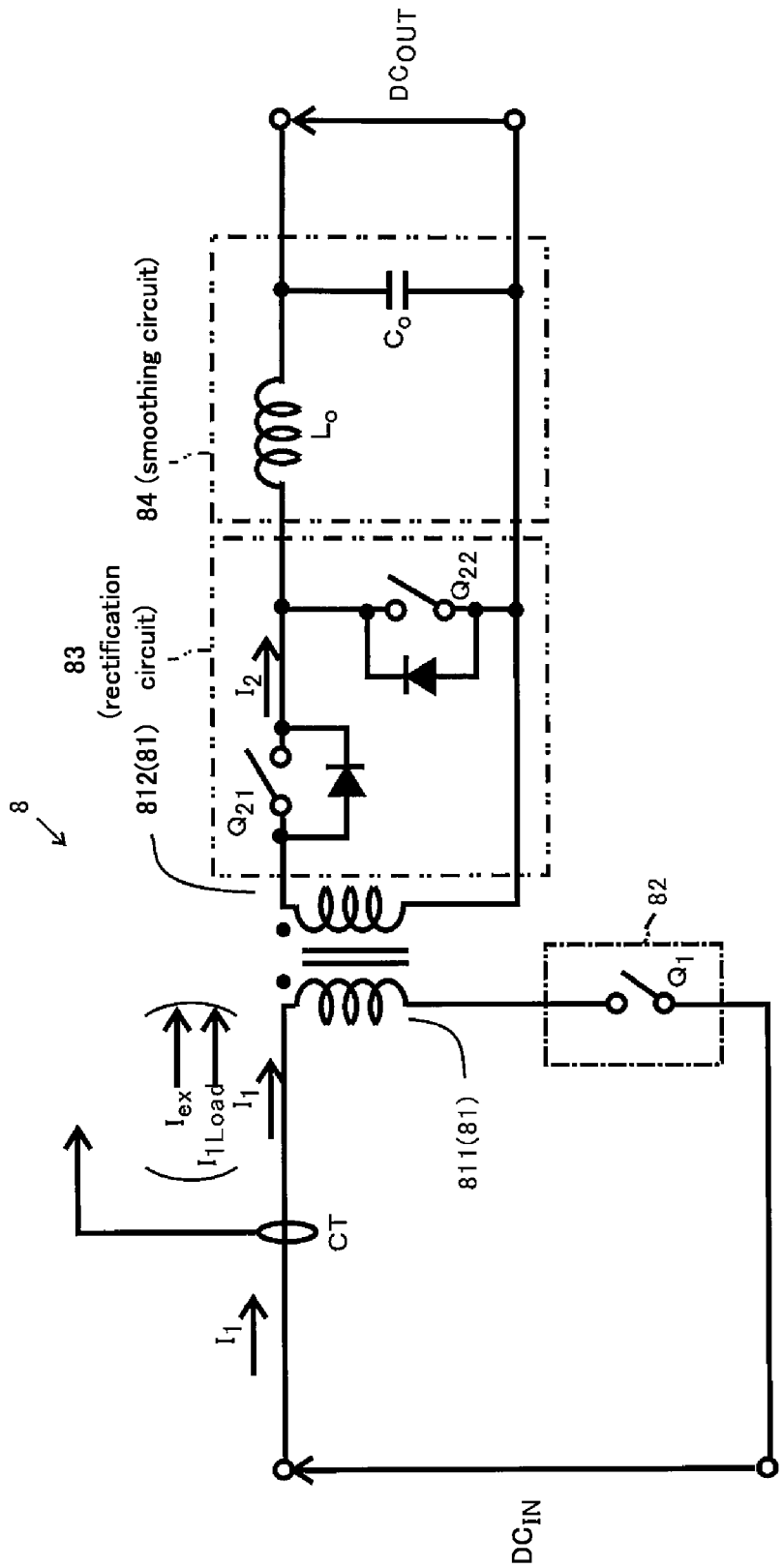
FIG. 11 is a circuit diagram showing a conventional transformer current measuring system, which enables magnetic-flux reset of a transformer.
Figure 12:
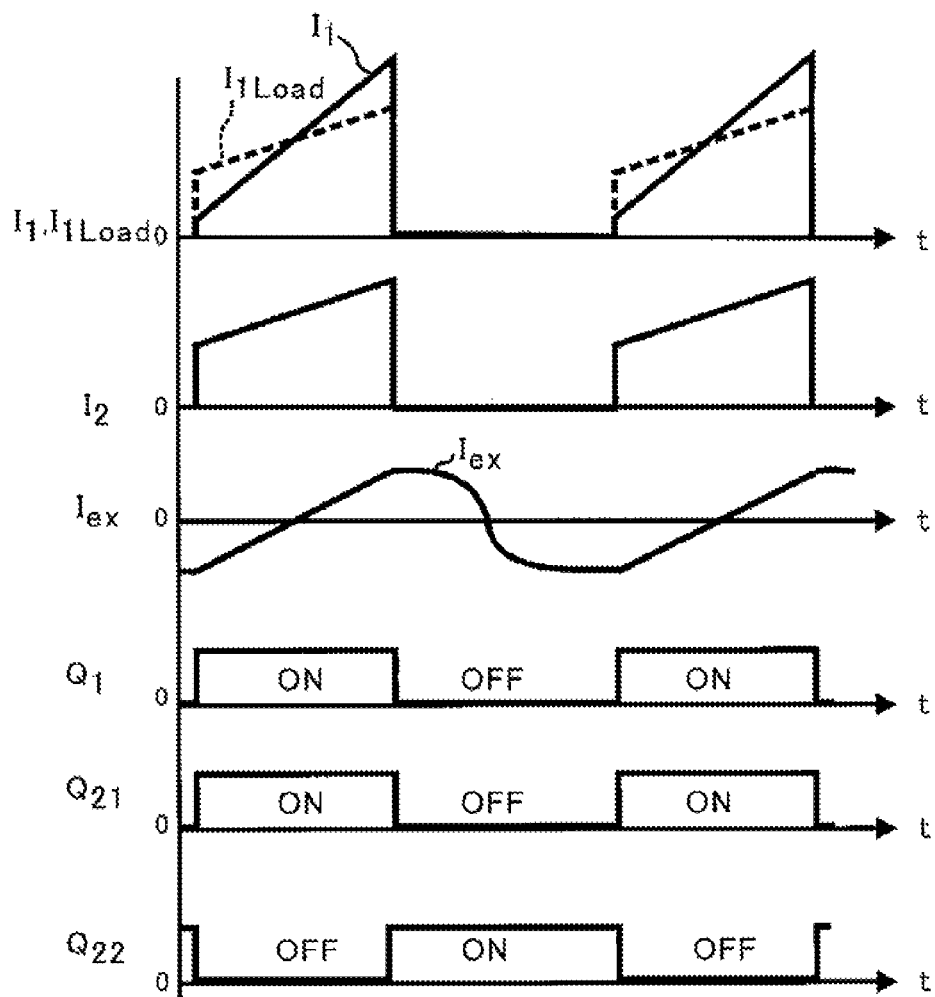
FIG. 12 is a diagram showing waveform of each part of a power converter of FIG. 11.
Figure 13:
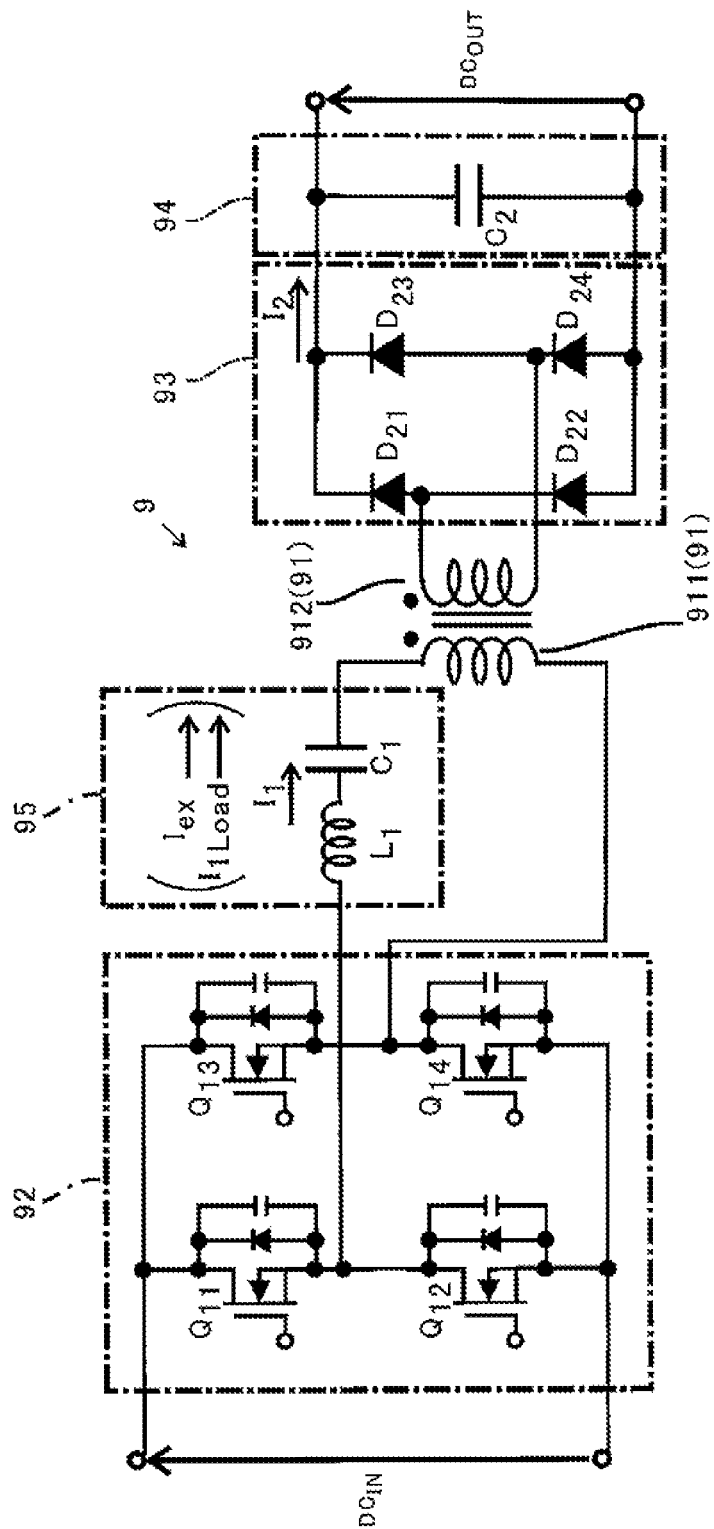
FIG. 13 is a circuit diagram showing a ZVS type power converter for performing switching, to which a transformer current measuring system of prior art is applied.

FIG. 10 is a circuit diagram of a switching power source 1B including a current detection circuit 10 according to a third embodiment of the present invention. The switching power source 1B differs from the switching power source 1A according to the second embodiment of the present invention shown in FIG. 8, in that an inductor, which forms a resonance circuit with a capacitor Cr, is made up of two inductors, that is, inductors Lr1 and Lr2, and the position to which a current detection circuit 10 is connected is different from that of the switching power source 1A. In addition, reference numbers, which are the same as those of the switching power source 1A, are assigned to structural elements of the switching power source 1B, which are the same as those of the switching power source 1A, and description thereof is omitted.

The source of the switching element Q5, and the drain of the switching element Q6 respectively are connected to one end of the inductor Lr1, and one end of the primary winding T1 of the transformer T is connected to the other end of the inductor Lr1 through the current detection unit 101. The other end of the primary winding T1 of the transformer T is connected to one end of the inductor Lr2, and a negative terminal of a direct-current power source Vin is connected to the other end of inductor Lr2 through the capacitor Cr.

The inductor Lma is in parallel connected to a series connection portion, in which the inductor Lr1, the current detection unit 101, and the primary winding T1 of the transformer T are in series connected.

The above-described switching power source 1B can have the same effects as those of the switching power source 1A.

The present invention is not limited to the above-mentioned embodiments, and various changes and applications may be made without departing from the scope of the invention.

For example, in the above-mentioned second and third embodiments, although the inductor Lma is directly connected to the source of the switching element Q5 and the drain of the switching element Q6, it is not limited thereto. For example, in FIG. 8, when the connecting point of the source of the switching element Q5 and the drain of the switching element Q6 is shown as a point P and a connecting point of the inductor Lr and the inductor Lma is shown as a point Q, an inductor may be provided between the points P and Q, so that the points P and Q may be connected to each other through this inductor. Moreover, for example, in FIG. 10, when a connecting point of the source of the switching element Q5 and the drain of the switching element Q6 is shown as a point X and a connecting point of the inductor Lr1 and the inductor Lma is shown as a point Y, an inductor may be provided between the points X and Y, so that the points X and Y may be connected to each other through this inductor.

Moreover, in above-mentioned second and third embodiments, although current resonance type power sources are respectively used for the switching power sources 1A and 1B, they are not thereto. In addition, although in each of the switching power sources 1A and 1B, which is a current resonance type switching power source, the inductor Lr forms the resonance circuit together with the capacitor Cr, in case of a switching power source which is other than a current resonance type, such an inductor Lr is provided in order to perform a zero bolt switching (ZVS).

Moreover, although a half bridge circuit is provided in the switching power sources 1A and 1B in the above-mentioned second and third embodiments, they are not limited thereto. For example, a full bridge circuit or a forward type circuit etc. may be provided therein.

REFERENCE NUMBERS

1: DC/DC converter
1A, 1B: Switching power source
10: Current Detection circuit
11: Transformer
12: Switching circuit
13: Rectification circuit
14: Smoothing circuit
15: Resonance circuit
18: Direct current power source
101: Current detection unit
111: Primary winding
112: Secondary winding
$C_1$, $C_2$, $C_O$, $C_r$: Capacitors
CT: Current detector (current transformer)
$L_1$, $L_a$, Lm, Lma, $L_O$, $L_r$, Lr1, Lr2: Inductors
$Q_1$, $Q_{11}$, $Q_{12}$, $Q_{13}$, $Q_{14}$, $Q_{21}$, $Q_{22}$: Switches
Q5, Q6, Q7, Q8: Switch elements
T: Transformer

The invention claimed is:

1. A current detection circuit of a switching power source having a transformer, which detects current flowing through a primary side of the transformer, comprising:
   a current detection unit, which is series connected to a primary winding of the transformer so that a series circuit part which has a first terminal and a second terminal is formed by the primary winding and the current detection unit, and which detects current flowing through the primary side of the transformer, and
   an inductor having both ends, wherein the both ends of the inductors are respectively connected to the first terminal and the second terminal of the series circuit part formed by the current detection unit and the primary winding of the transformer series connected to the current detection unit, so that the inductor is in parallel connected to the series circuit part.

2. The current detection circuit according to claim 1, wherein an inductance of the inductor is smaller than an excitation inductance of the primary winding of the transformer.

3. A switching power source having a transformer and a first inductor connected series to a primary winding of the transformer, comprising:
   a current detection circuit for detecting current flowing through the primary side of the transformer, wherein the current detection circuit includes a current detection unit, which is series connected to the primary winding of the transformer so that a series circuit part is formed by the first inductor, the current detection circuit and the primary winding of the transformer series connected to the first inductor, and
   a second inductor, which is in parallel connected to the series circuit part formed by the first inductor, the current detection circuit and the primary winding of the transformer series connected to the first inductor and the current detection circuit, wherein the second inductor reduces exciting current.

4. The current detection circuit according to claim 3, wherein an inductance of the second inductor is smaller than an excitation inductance of the primary winding of the transformer.

5. A transformer current measuring system, wherein a current detector is series connected to a primary winding of a transformer so that a series circuit part which has a first terminal and a second terminal is formed by the primary winding and the current detector, and detects current flowing through the primary side of the transformer, and an inductor having both ends, wherein the both ends of the inductor are respectively connected to the first terminal and the second terminal of the series circuit part formed by the current detector and the primary winding of the transformer series connected to the current detector, so that the inductor is in parallel connected to the series circuit part.

6. The transformer current measuring system according to claim 5, wherein an inductance of the inductor is smaller than an excitation inductance of the primary winding.

7. A current detection circuit of a switching power source having a transformer, which detects current flowing through a primary winding of the transformer, comprising:
   a current detection part, which is series connected to the primary winding of the transformer so that a series circuit part having first and second ends is formed by the current detection part and the primary winding of the transformer series connected to the current detection part and, which detects current flowing through the primary side of the transformer, and
   an inductor connected in parallel to the series circuit part formed by the current detection part and the primary winding of the transformer series connected to the current detection part, wherein both ends of the inductor are respectively connected to the first and second ends of the series circuit part, wherein the inductor reduces exciting current.

* * * * *